(12) United States Patent
Lucas et al.

(10) Patent No.: US 11,900,042 B2
(45) Date of Patent: Feb. 13, 2024

(54) STOCHASTIC-AWARE LITHOGRAPHIC MODELS FOR MASK SYNTHESIS

(71) Applicant: Synopsys, Inc., Mountain View, CA (US)

(72) Inventors: Kevin Dean Lucas, Austin, TX (US); Yudhishthir Prasad Kandel, Durham, NC (US); Ulrich Welling, Dornach (DE); Ulrich Karl Klostermann, Munich (DE); Zachary Adam Levinson, Austin, TX (US)

(73) Assignee: Synopsys, Inc., Sunnyvale, CA (US)

( * ) Notice: Subject to any disclaimer, the term of this patent is extended or adjusted under 35 U.S.C. 154(b) by 131 days.

(21) Appl. No.: 17/522,574

(22) Filed: Nov. 9, 2021

(65) Prior Publication Data

US 2022/0146945 A1 May 12, 2022

Related U.S. Application Data

(60) Provisional application No. 63/112,733, filed on Nov. 12, 2020.

(51) Int. Cl.
| | | |
|---|---|---|
| *G06F 30/30* | (2020.01) | |
| *G03F 7/00* | (2006.01) | |
| *G06F 30/398* | (2020.01) | |
| *G03F 1/36* | (2012.01) | |
| *G03F 1/70* | (2012.01) | |

(52) U.S. Cl.
CPC .............. *G06F 30/398* (2020.01); *G03F 1/36* (2013.01); *G03F 1/70* (2013.01); *G03F 7/705* (2013.01); *G03F 7/70433* (2013.01); *G03F 7/70441* (2013.01)

(58) Field of Classification Search
None
See application file for complete search history.

(56) References Cited

U.S. PATENT DOCUMENTS

| | | | |
|---|---|---|---|
| 2017/0010538 A1* | 1/2017 | Hansen | ................. G03F 1/70 |
| 2018/0322228 A1 | 11/2018 | Kumar et al. | |
| 2019/0187570 A1 | 6/2019 | Mack | |
| 2021/0132486 A1 | 5/2021 | Melvin, III et al. | |
| 2022/0179321 A1* | 6/2022 | Ma | .................. G06T 7/0004 |

FOREIGN PATENT DOCUMENTS

| | | |
|---|---|---|
| WO | WO 2015/121127 A1 | 8/2015 |
| WO | WO 2021/062040 A1 | 4/2021 |

OTHER PUBLICATIONS

De Bisschop, P. "Optical Proximity Correction: A Cross Road of Data Flows." Japanese Journal of Applied Physics, vol. 55, No. 6S1, May 31, 2016, pp. 1-11.

(Continued)

*Primary Examiner* — Leigh M Garbowski
(74) *Attorney, Agent, or Firm* — Fenwick & West LLP

(57) ABSTRACT

In some aspects, a mask pattern is accessed. The mask pattern is for use in a lithography process that prints a pattern on a wafer. The mask pattern is applied as input to a deterministic model of the lithography process to predict a characteristic of the printed pattern. The deterministic model is deterministic, but it accounts for local stochastic variations of the characteristic in the printed pattern.

19 Claims, 7 Drawing Sheets

(56) References Cited

OTHER PUBLICATIONS

Levinson, Z. et al. "Compact Modeling to Predict and Correct Stochastic Hotspots in EUVL." Proceedings of SPIE, Extreme Ultraviolet (EUV) Lithography XI, vol. 11323, Mar. 23, 2020, pp. 1-8.
PCT International Search Report and Written Opinion, PCT Application No. PCT/US2021/058834, dated Mar. 4, 2022, 18 pages.
Wei, C-I. et al. "Better Prediction on Patterning Failure Mode with Hotspot Aware OPC Modeling." Proceedings of SPIE, Metrology, Inspection, and Process Control for Semiconductor Manufacturing XXXV, vol. 11611, Feb. 22, 2021, pp. 1-12.

* cited by examiner

STOCHASTIC-AWARE LITHOGRAPHIC MODELS FOR MASK SYNTHESIS

RELATED APPLICATION

This application claims priority under 35 U.S.C. § 119(e) to U.S. Provisional Patent Application Ser. No. 63/112,733, "Stochastic-Aware Lithographic Models For Mask Synthesis," filed Nov. 12, 2020. The subject matter of all of the foregoing is incorporated herein by reference in its entirety.

TECHNICAL FIELD

The present disclosure relates to lithography modeling and mask synthesis, including for extreme ultraviolet (EUV) masks.

BACKGROUND

One step in the manufacture of semiconductor wafers involves lithography. In a typical lithography process, a source produces light that is collected and directed by collection/illumination optics to illuminate a lithographic mask. Projection optics relay the pattern produced by the illuminated mask onto a wafer, exposing resist on the wafer according to the illumination pattern. The patterned resist is then used in a process to fabricate structures on the wafer.

Various technologies are directed to improving the lithography process, including the design of the lithographic mask. In many of these technologies, the lithographic mask design is used as an input to some process model, which then predicts some process result. This result may be used to modify the design of the lithographic mask. In many cases, the process model may be regressed against data from actual fabrication experiments. Different lithographic mask patterns containing test patterns are run through the lithographic process. The resulting structures are measured and used to calibrate the process model.

Current process models typically do not directly address variations that may occur due to stochastic variations in the lithography process itself. Rather, the lithographic mask pattern is used as input to a model that models the lithography process as a fully deterministic process. However, as lithography moves to shorter wavelength ranges (e.g., extreme ultraviolet (EUV) at approximately 13.3-13.7 nm) and smaller geometries (e.g., 10 nm, 7 nm and smaller technology nodes, with approximately 20 nm, 14 nm and smaller minimum feature sizes), stochastic variations within a relatively small area (local stochastic variations) become more significant and the conventional approach may result in sub-optimal mask designs.

SUMMARY

In some aspects, a mask pattern is accessed. The mask pattern is for use in a lithography process that prints a pattern on a wafer. The mask pattern is applied as input to a deterministic model of the lithography process to predict a characteristic of the printed pattern. The deterministic model is deterministic (e.g., not a Monte Carlo simulation), but it accounts for local stochastic variations of the characteristic in the printed pattern.

In some embodiments, the deterministic model is a compact model that predicts hotspots in the printed pattern as a function of the mask pattern and also as a function of dose, focus, and a stochastic model property that correlates to local stochastic variations of the predicted characteristic. Examples of stochastic model properties may include diffused aerial image signal; acid concentration or density; quencher concentration or density; inhibitor concentration or density; gradient of aerial image, acid, quencher, or inhibitor signal; mask pattern density; secondary electron concentration; ligand concentration; and resist surface tension. The compact model is regressed against empirical data that includes local stochastic variations of the predicted characteristic. Examples of empirical data may include line-edge roughness, critical dimension (CD) variation, worst case CD, and number of empirical measurements with CD less than or greater than a specific criteria.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
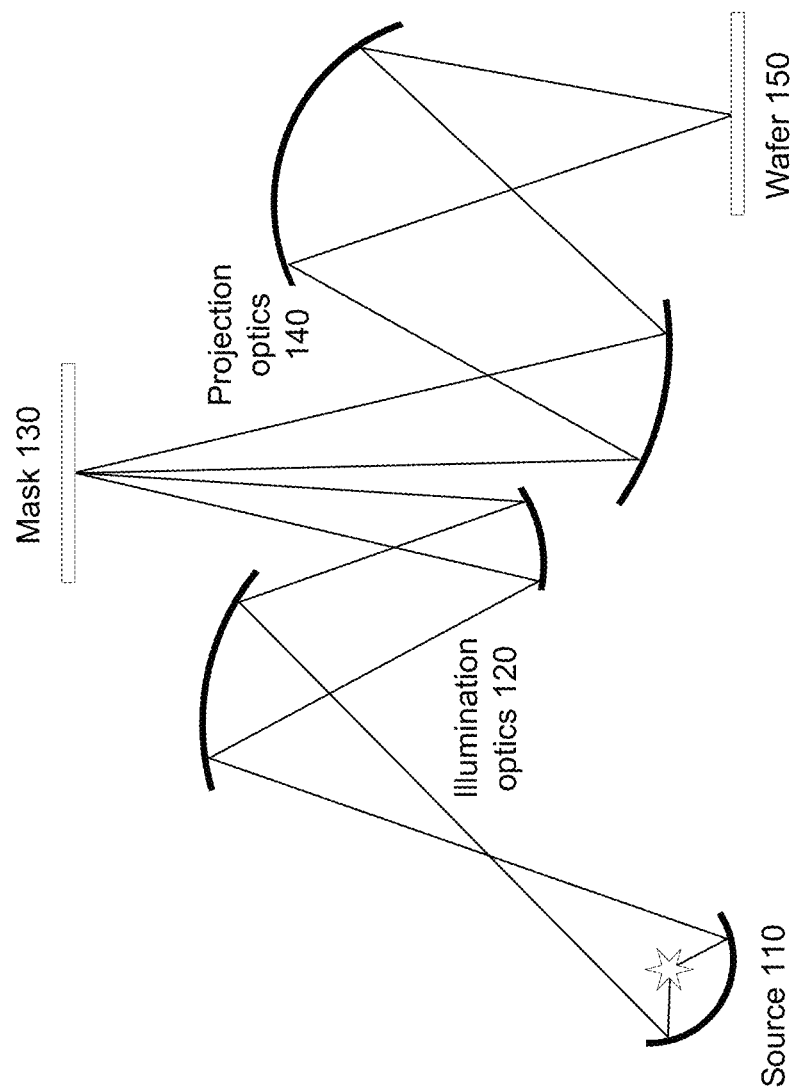
FIG. 1 depicts an EUV lithography process suitable for use with embodiments of the present disclosure.

Aspects of the present disclosure relate to "stochastic-aware" lithographic models for mask synthesis. Particularly at shorter wavelengths and higher photon energies, local stochastic effects in the lithography process itself become more significant. Local stochastic variations are variations that result from processes that have some randomness on a local level. For example, higher photon energies at EUV wavelengths means that fewer photons are required to achieve a given energy exposure compared to longer wavelengths. Photon events have some randomness (i.e., probability distribution), which becomes more pronounced if the total photon count is low. As a result, the variation of photon counts at any particular location on the wafer can result in stochastic defect mechanisms that were previously negligible or non-existent with higher numbers of photons. Other components of the lithography process that may have local stochastic variations include photon distribution, secondary electron distribution, photo acid generator (PAG) distribution, quencher distribution, and inhibitor distribution. These stochastic effects are local, meaning that they may occur across a relatively small area, for example within a 10 um×10 um or smaller area of the printed pattern.

In various embodiments of the present disclosure, a deterministic model of the lithography process accounts for these local stochastic variations in the lithography process. In one approach, the model is a compact model that may be used for mask synthesis. The compact model is a parameterized model. The parameters may be referred to as model properties. The values of the model properties may be determined by regression against empirical data. The model properties include at least one stochastic model property that correlates to local stochastic variations in the lithography process. Examples of possible stochastic model properties include photon density, pattern density, optical signal intensity, optical signal gradient, secondary electron density, secondary electron gradient, photoacid concentration, resist quencher concentration, resist inhibitor concentration, resist inhibitor gradient, metallic resist ligand concentration. etc. Although the model accounts for stochastic variations, the model itself is deterministic. That is, for any given input, the output predicted by the model is always the same (there is no stochastic variation in the model's output), but the output has been adjusted to account for stochastic variations in the lithography process.

Advantages of the present disclosure include but are not limited to the following. Accounting for local stochastic variations yields more accurate predictions, since the stochastic effects are not neglected. In addition, using a deterministic model to do so can reduce the runtime of the model. In other approaches, stochastic variations may be modelled by a stochastic model in which the same simulation is run many times using statistically varying conditions (e.g., Monte Carlo simulations). However, that approach requires many runs in order to obtain a result based on the different predictions from the different runs, whereas a deterministic model yields the predicted result in a single run. The regression of parameterized models against empirical data also yields more accurate predictions. It also permits some flexibility in the model form. The constants and parameters used in the model do not have to be calculated with exact precision and the physical processes that are taking place also do not have to be modeled with exact precision, because the model accuracy may be achieved by calibrating against empirical data.

FIG. 1 depicts an EUV lithography process suitable for use with embodiments of the present disclosure. In this system, a source 110 produces EUV light that is collected and directed by collection/illumination optics 120 to illuminate a mask 130. Projection optics 140 relay the pattern produced by the illuminated mask onto a wafer 150, exposing resist on the wafer according to the illumination pattern. The exposed resist is then developed, producing patterned resist on the wafer. This printed pattern is used to fabricate structures on the wafer, for example through deposition, doping, etching or other processes.

In FIG. 1, the light is in the EUV wavelength range, around 13.5 nm or in the range 13.3-13.7 nm. At these wavelengths, the components typically are reflective, rather than transmissive. The mask 130 is a reflective mask and the optics 120, 140 are also reflective and off-axis. This is just an example. Other types of lithography systems may also be used, including at other wavelengths, using transmissive masks and/or optics, and using positive or negative resist.

Figures 2A, 2B:
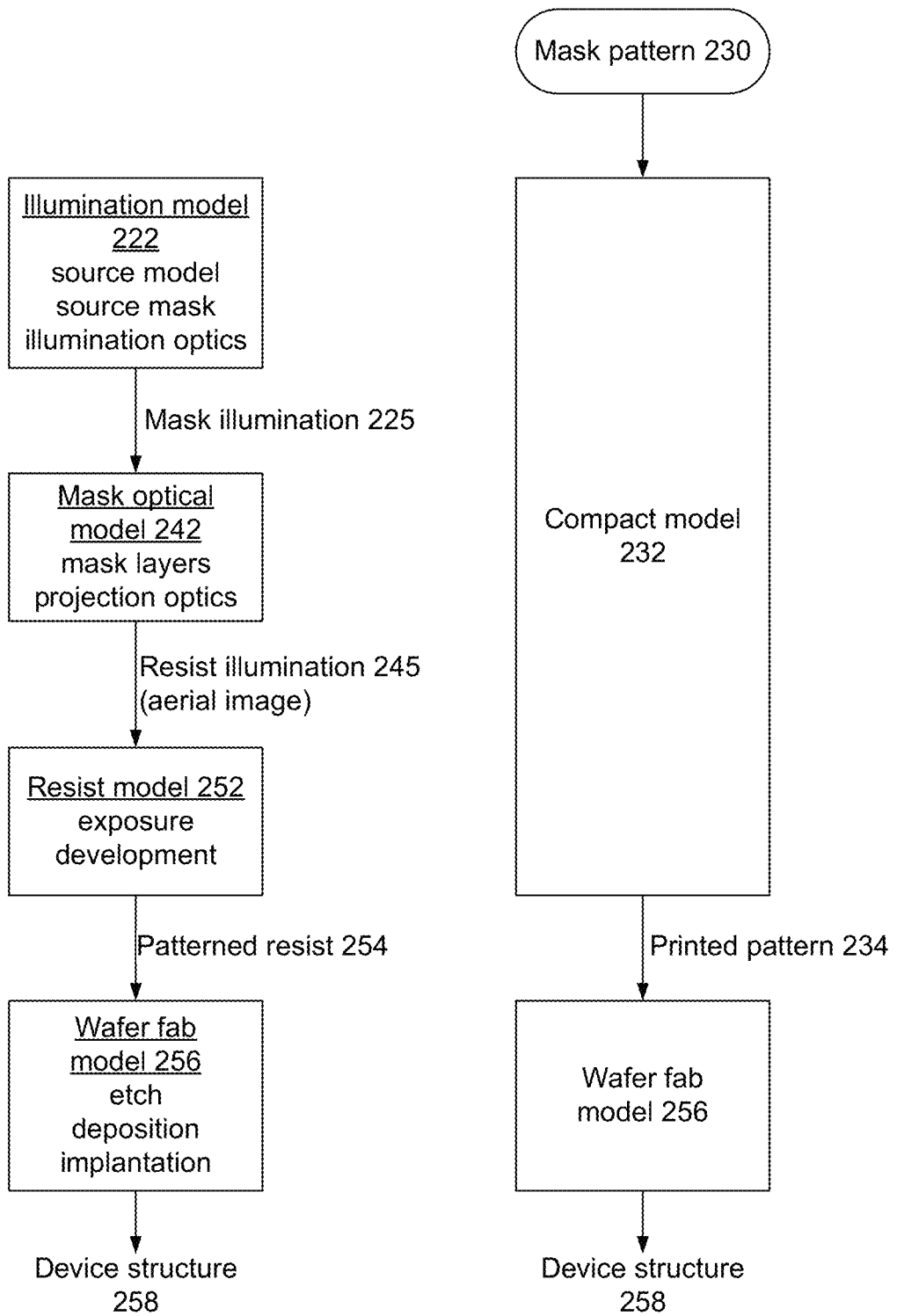
FIG. 2A depicts a flowchart for simulation of a lithography process.
FIG. 2B depicts a flowchart for simulation of a lithography process using a compact model that accounts for local stochastic variations.

FIG. 2A depicts a simulation of a lithography process. Illumination model 222 models the source 110 and illumination optics 120 of FIG. 1. These are used to predict the light pattern 225 that illuminates the mask. Model 242 accounts for the effect of the lithographic mask 130 and projection optics 140, to predict the illumination 245 exposing the resist. This is sometimes referred to as the aerial image 245. The resist model 252 may include effects such as exposure of the resist from the aerial image, secondary electron generation, chemical reactions, and subsequent removal, whether by chemical development, etch or other processes. The removal of resist leaves a layer of patterned resist 254 over the wafer, also referred to as the printed pattern. The wafer fab model 256 then models subsequent processing, for example, etching, deposition, doping, implantation, etc., resulting in device structure 258 on the wafer.

For convenience, separate boxes are shown in FIG. 2A to correspond to physical components or processes, but the models need not be implemented in this way. For example, all of these effects may be combined into a single compact model, which may be used for full chip evaluation, as shown in FIG. 2B. Such a model predicts the resulting patterned resist or an equivalent aerial image (referred to as the printed pattern 234 in FIG. 2B) from the mask pattern 230. Such a single model includes effects from the source, optics and resist and, in the embodiments described herein, also accounts for local stochastic variations in the lithography process. The compact model 232 may be designed to process the mask pattern for an entire die in a rapid manner. As many as $10^{18}$ or more simulations may be necessary to complete a full chip correction on a device such as a microprocessor.

The compact model 232 may be a parameterized, deterministic model that predicts the printed pattern 234 and/or characteristics of the printed pattern as a function of the model parameters, also referred to as model properties. For example, the compact model may predict hot spots (defects in the printed pattern) or the failure rate in the pattern as a function of the mask pattern 230, dose and focus of the lithography system and also as a function of certain model properties that correlate to the local stochastic variations. These model properties will be referred to as stochastic model properties.

Compact models may be regressed against empirical data. Measured data is collected for different mask patterns. The resulting patterns fabricated on the wafer are measured. These are typically Critical Dimension Scanning Electron Microscope (CDSEM) measurements of photoresist and/or etch structures. Other measurements such as atomic force microscopy (AFM) may also be used.

One measure of the quality of patterned resist 234 is the critical dimension (CD). CD is the dimension of important features in the patterned resist or the dimension of important spacings between features in the patterned resist. Typically, the minimum CD is the smallest line width or space width printed in the resist. As such, it is a measure of the resolution of the resist and lithography process. Referring again to FIGS. 2A and 2B, the simulation results 254, 234 in these figures may include a prediction of CD. Another common output is the predicted aerial image, or contours of constant intensity in the aerial image.

Compact models may be used for mask synthesis or mask correction. Mask corrections include optical proximity correction, sub-resolution assist features, phase shifting masks, inverse lithography techniques and other types of resolution enhancement technologies. In optical proximity correction (OPC), the geometric shapes in the mask pattern are perturbed based on the predicted result. In sub-resolution assist features, sub-wavelength features are added to or removed from the mask pattern to introduce beneficial diffraction and scattering. In phase-shifting masks, different mask shapes introduce different amounts of phase shift to introduce beneficial interference in the resulting illumination patterns.

Figure 3:
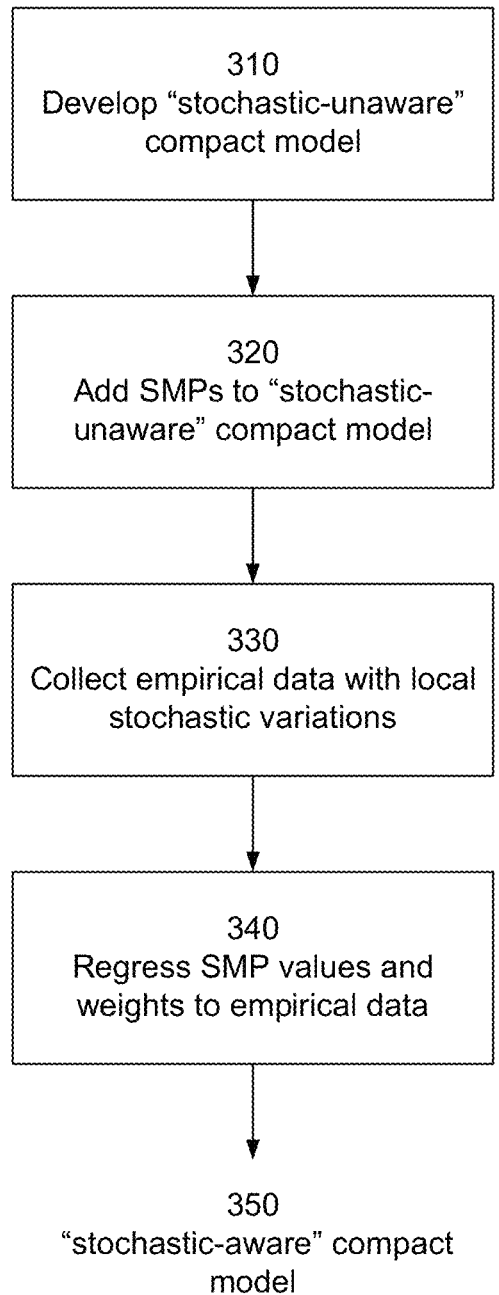
FIG. 3 depicts a flowchart to add stochastic model properties to a compact model that does not account for local stochastic variations.

FIG. 3 depicts a flowchart to add stochastic model properties to a compact model that does not account for local stochastic variations. This flow will be explained using the examples shown in FIGS. 4 and 5. A compact model 310 predicts the location of hotspots (e.g., defects) on a wafer, but does not account for increased failure rates due to local stochastic variations. For example, this "stochastic-unaware" compact model 310 may predict the patterned resist CD as a function of dose, focus and mask pattern. It may also predict the failure rate or identify hot spots for a process window (PW) defined by a range of these parameters. The compact model 310 may be a parameterized model that is regressed against empirical data.

The compact model 310 may include observable PW mask or scanner parameters in the model, such as dose, focus and mask bias. These are set to correspond to physically measurable quantities set during the experimental lithographic exposure. The compact model 310 may also include non-physical model parameters or parameters in the model not observable on the mask or scanner, such as chemical blur, inhibitor concentration or mechanical stress, etc. These cannot be varied in a directly observable manner during lithographic exposure and their parameter coefficients and weights are fit to the average of observed wafer measurements for different resist or etched patterns.

Figure 4A:
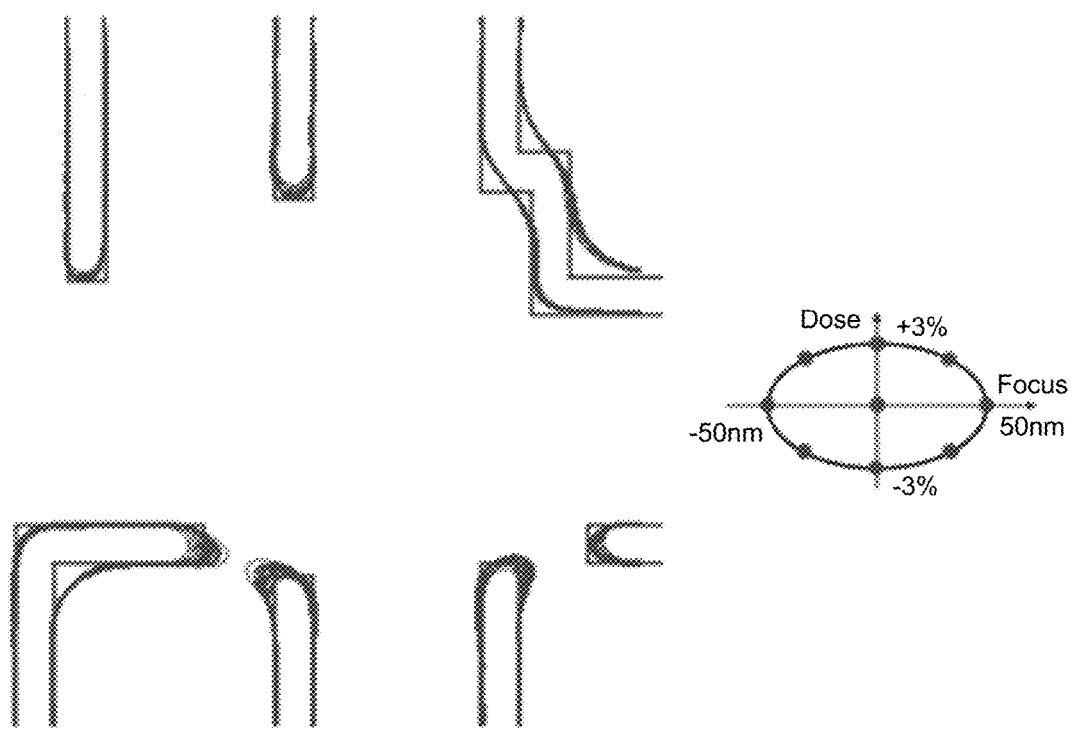
FIGS. 4A and 4B depict simulation of a lithography process.
Figure 4B:
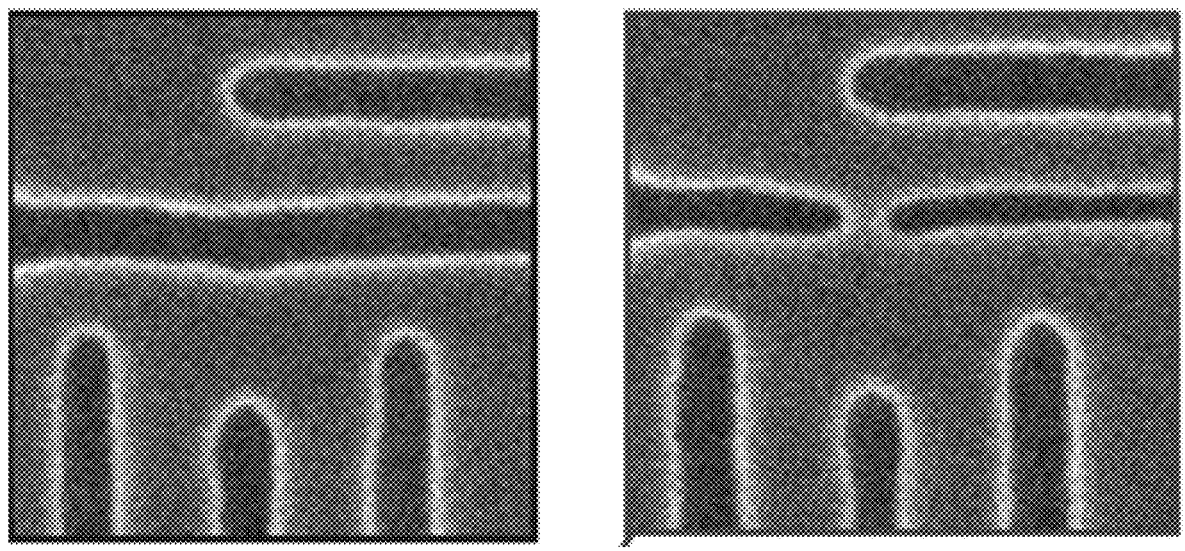

FIGS. 4A and 4B depict simulation of a lithography process using such a compact model 310. In FIG. 4A, the rectilinear shapes are the mask pattern and the curves show the resulting printed resist shape on the wafer at different doses and focuses, as shown by the elliptical process window diagram on the righthand side of FIG. 4A. In this example, the process window is +/−50 nm defocus and +/−3% dose. The curves in FIG. 4A correspond to the dots in the PW diagram.

The model 310 may be regressed against empirical data such as shown in FIG. 4B. FIG. 4B shows two different cases. The left case is for an optimal process window condition: no focus or dose variation from ideal. The left side of FIG. 4B shows the actual printed structure on wafer, which does not have any defects. The right case is for conditions on the edge of the process window. In this case, the actual printed structure has a defect where there is a break in the printed line. The results predicted by the model 310 may be improved by comparing to the measured results.

The model 310 in FIG. 4 accounts for variations in dose and focus, but does not account for local stochastic variations. Returning to FIG. 3, this stochastic-unaware model is modified 320, 330, 340 to account for local stochastic variations. Some model forms or parameters, which collectively will be referred to as stochastic model properties (SMPs), are added 320 to the compact model. Empirical data is gathered 330 which reflects the effects of the local stochastic variations. The SMPs are regressed 340 against the empirical data with local stochastic variations. Some kind of statistical local variation on the wafer is used for the regression 340. This could be worst case CD, CD variation metrics or line-edge roughness or characteristics of defect locations, etc.

The stochastic-unaware model 310 defines what are some observable process parameters such as the scanner dose, focus, or feature CD on the mask. That model 310 can account for variations in the observable process parameters, such as if the scanner dose is slightly more or less than nominal, or there is slight defocus, or the feature CD is slightly larger or smaller than nominal. The stochastic-unaware compact model 310 may account for those types of variations.

In FIG. 3, the stochastic-unaware model 310 is modified to account for stochastic variations that occur locally, say within a view of a single CDSEM image. The compact model 310 is modified to include these local stochastic variations, and it is modified by adjusting these additional SMPs. This is adjusting the model form so that the new "stochastic-aware" model 350 form predicts not only the deterministic variation but also the local stochastic variations. Examples include varying CDs across a line, or varying CDs across multiple repeating patterns within a local area of the wafer.

The stochastic-aware model 350 may add "stochastic-aware" lithographically non-physical model parameters or parameters in the model not observable on the mask or scanner, such as secondary electron density, chemical interaction range, inhibitor yield, additional chemical blur, additional mechanical stress, etc., that cannot be varied during lithographic exposure but whose parameter coefficients and weights are fit to statistical variation observed in repeated local wafer measurements for each of multiple different individual resist or etched patterns.

For example, the stochastic-unaware model 310 may predict the location of a line edge on the wafer. However, because of the local stochastic variations, there is actually a probability distribution function for the location of the line edge. Perhaps the distribution is Gaussian, with an expected location and some standard deviation from the expected location. The stochastic-unaware model 310 might predict the expected location but ignores the probability distribution. The stochastic-aware model 350 takes into account the fact that there is a probability distribution. It may not expressly predict what the distribution is, but it takes into account the effect of the distribution. For example, it may predict the line edge location based on one standard deviation away from the expected location.

Note that the "stochastic-aware" model 350 does not itself have to be stochastic. It may be a deterministic model that always produces the same prediction for the same input, rather than a prediction with some random element, but the prediction accounts for local stochastic effects. In this example, the model 350 accounts for the Gaussian distribution by always predicting the line edge location based on the standard deviation of the probability distribution.

Note that these variations are local variations—they occur over a very local area, such as within the field of view of a CDSEM image which typically has dimension between 0.5 and 10 microns per side. In some cases, there may be variations that are visible across a 10 by 10 array of patterns or a 20 by 20 array of patterns or a 1 by 40 array of 1D patterns. As a counterexample, dose and defocus may also vary, but they are not local variations since these variations affect a much larger area, e.g., a thousand microns per side, or even the entire exposure field on the wafer.

Put in another way, a "stochastic" hotspot may be defined as a pattern that is observed on the wafer to fail significantly more frequently than is predicted by traditional "stochastic-unaware" hotspot detection methods. A stochastic model property (SMP) is a model property which correlates to or is predictive of the stochastic hot spot failure.

Figure 5:
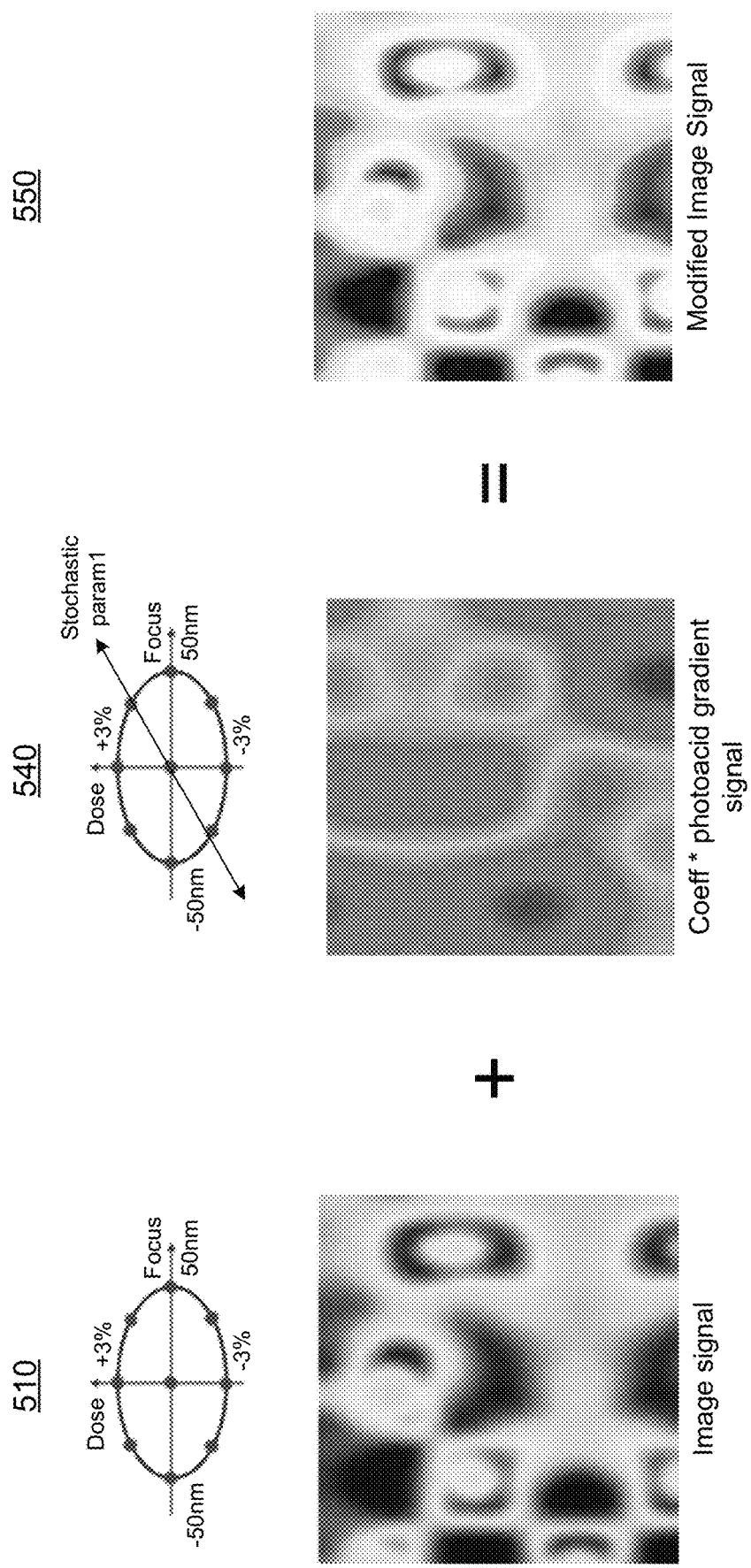
FIG. 5 depicts process window axes diagrams and simulated images from the process of FIG. 3.

FIG. 5 depicts the process of FIG. 3, using predicted signal intensity images. These signal intensity images can be of the aerial image or of a chemical property in the resist, for example the photoacid concentration. In this example, the left column 510 represents the stochastic-unaware compact model 310, the center column 540 is a correction for the local stochastic variations, and the right column 550 represents the resulting stochastic-aware model 350. The bottom row shows predicted signal intensity images and the ovals on the top row represent the parameters considered in the process window.

In 510, the compact model 310 is developed for the process window with variations in dose and focus, but not accounting for local stochastic variations. In 540, SMPs (stochastic param1 in the figure on the top row) are added to the model to account for local stochastic process variations. They add a correction factor to the signal image. The resulting signal image is shown in 550. In this example, $$\text{modified image signal} = \text{original image signal} + \text{coef} \ast \text{photoacid gradient signal} \quad (1)$$

The photoacid gradient is the gradient of the photoacid concentration in the resist after exposure, and coef is a negative or positive parameter determined based on comparison with empirical data. Other examples may use non-linear combinations of the original image signal and the SMPs to in order to create the modified image signal.

Figure 6:
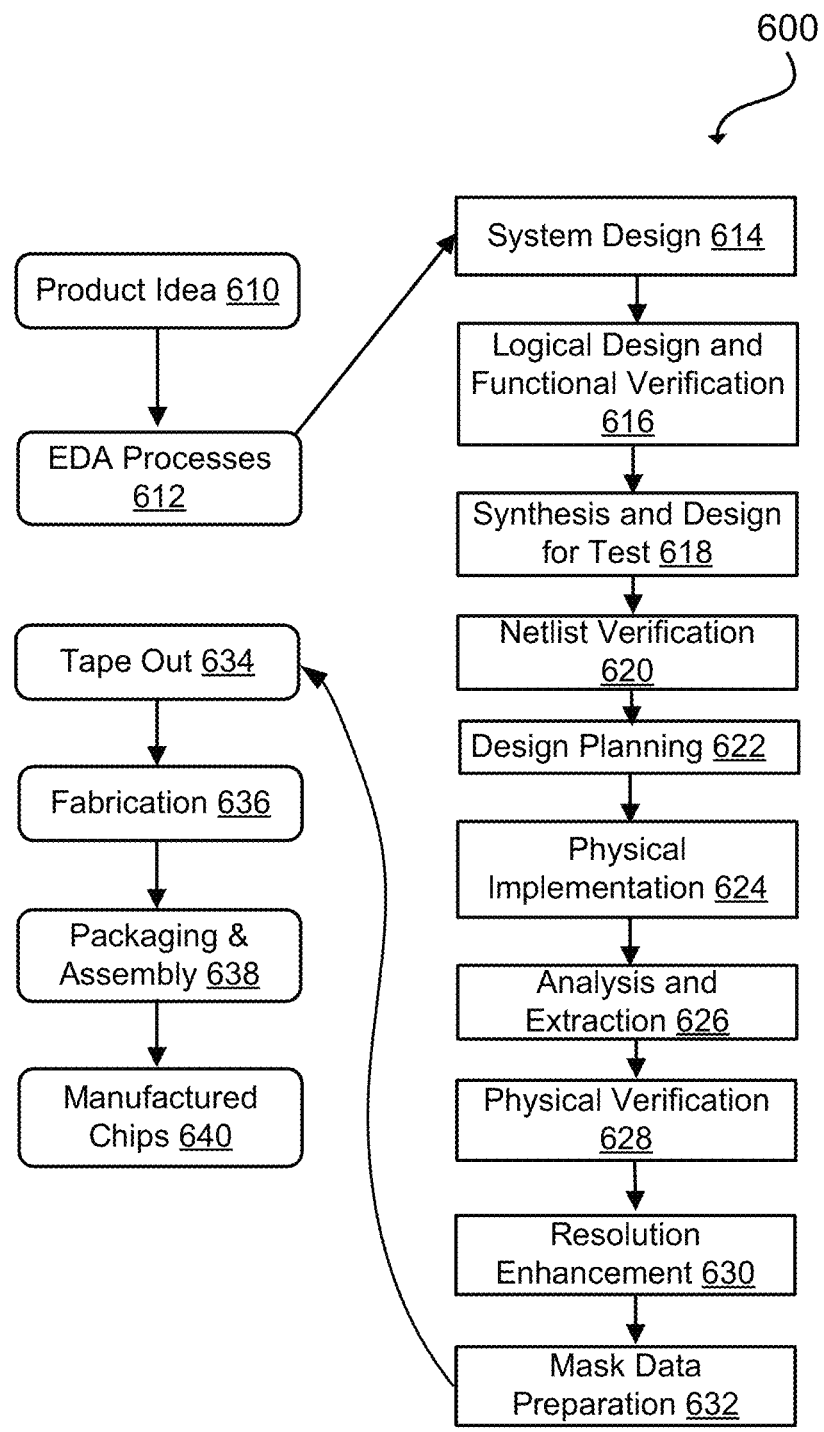
FIG. 6 depicts a flowchart of various processes used during the design and manufacture of an integrated circuit in accordance with some embodiments of the present disclosure.

In this example, photoacid gradient is the SMP. Other SMPs may also be used. Examples may include:
  Photon density or diffused aerial image signal
  Non-linearly filtered aerial image signal
  Acid concentration or density
  Quencher concentration or density
  Inhibitor concentration or density
  Secondary electron concentration or density
  Ligand concentration or density
  Gradient of aerial image signal
  Gradient in acid, quencher, or inhibitor signal
  Log of the gradient of aerial image, acid, quencher, or inhibitor signal
  Square of the gradient of aerial image, acid, quencher, or inhibitor signal
  Mask pattern density
  Resist surface tension FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 6. The processes described by be enabled by EDA products (or tools).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
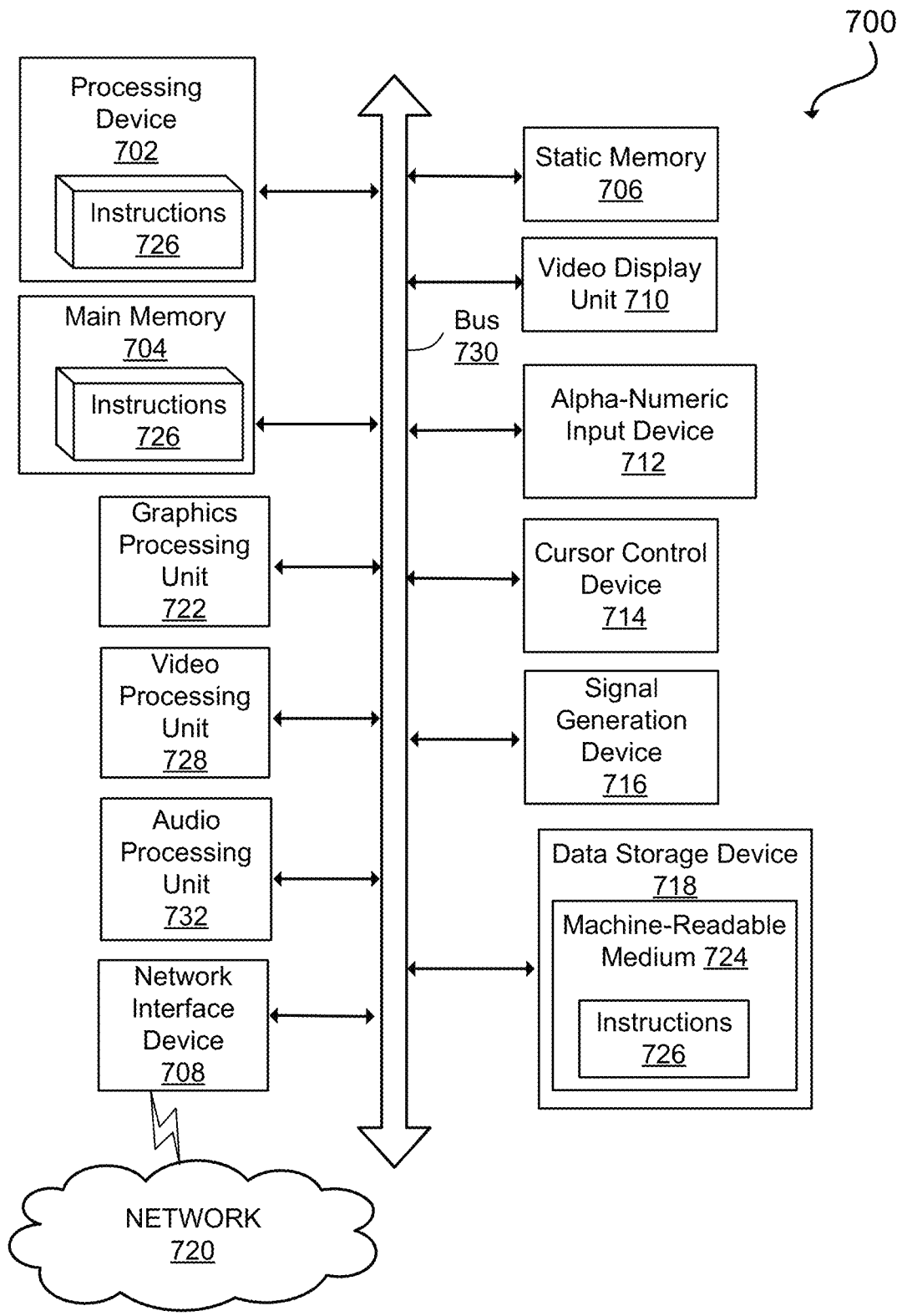
FIG. 7 depicts an abstract diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
accessing a mask pattern for use in a lithography process that prints a pattern on a wafer; and
applying, by a processor, the mask pattern to a deterministic model of the lithography process to predict a characteristic of the printed pattern that is subject to local stochastic variations, comprising:
applying the mask pattern to a deterministic compact model that predicts the characteristic of the printed pattern, wherein the compact model does not account for local stochastic variations of the characteristic; and
applying a deterministic correction to the predicted characteristic from the compact model, wherein the correction accounts for the local stochastic variations of the characteristic in the printed pattern.

2. The method of claim 1 wherein applying the correction to the predicted characteristic from the compact model comprises a linear combination of (a) the predicted characteristic from the compact model, and (b) the correction, wherein the correction is a function of a stochastic model property that correlates to the local stochastic variations of the predicted characteristic.

3. The method of claim 1 wherein applying the correction to the predicted characteristic from the compact model comprises a non-linear combination of (a) the predicted characteristic from the compact model, and (b) the correction, wherein the correction is a function of a stochastic model property that correlates to the local stochastic variations of the predicted characteristic.

4. The method of claim 1 wherein the compact model predicts the characteristic of the printed pattern as a function of dose, focus, and the mask pattern.

5. The method of claim 1 wherein the compact model is regressed against first empirical data, and the correction is regressed against second empirical data that includes local stochastic variations of the predicted characteristic.

6. A system comprising:
a memory storing instructions; and
a processor, coupled with the memory and to execute the instructions, the instructions when executed cause the processor to perform operations comprising:
accessing a mask pattern for use in a lithography process that prints a pattern on a wafer; and
applying the mask pattern to a deterministic model of the lithography process to predict a characteristic of the printed pattern that is subject to local stochastic variations, wherein the deterministic model comprises (a) a deterministic compact model that predicts the characteristic of the printed pattern but does not account for the local stochastic variations of the characteristic, and (b) a deterministic correction to the predicted characteristic from the compact model that accounts for the local stochastic variations of the characteristic in the printed pattern.

7. The system of claim 6 wherein the predicted characteristic of the printed pattern is used for mask synthesis and/or for mask correction.

8. The system of claim 7 wherein the mask pattern comprises a mask pattern for an entire die.

9. The system of claim 6 wherein the local stochastic variations comprise stochastic variations within a 10 um×10 um area of the printed pattern.

10. The system of claim 6 wherein the deterministic correction is a function of a stochastic model property, and the stochastic model property correlates to the local stochastic variations of the predicted characteristic.

11. The system of claim 10 wherein the operations further comprise: regressing the compact model against empirical data that does not include measurements of the stochastic model property.

12. The system of claim 10 wherein:
the at least one stochastic model property is one of diffused aerial image signal; acid concentration or density; quencher concentration or density; inhibitor concentration or density; gradient of aerial image, acid, quencher, or inhibitor signal; mask pattern density; secondary electron concentration; ligand concentration; and resist surface tension; and
the deterministic model predicts hotspots in the printed pattern as a function of the mask pattern.

13. A non-transitory computer readable medium comprising stored instructions, which when executed by a processor, cause the processor to perform operations comprising:
accessing a mask pattern for use in a lithography process that prints a pattern on a wafer; and applying the mask pattern to a deterministic model of the lithography process to predict a characteristic of the printed pattern that is subject to local stochastic variations, wherein the deterministic model comprises (a) a deterministic compact model that predicts the characteristic of the printed pattern but does not account for the local stochastic variations of the characteristic, and (b) a deterministic correction to the predicted characteristic from the compact model that predicts the characteristic of the printed pattern as a function of model properties that include at least one stochastic model property that correlates to the local stochastic variations of the predicted characteristic.

14. The non-transitory computer readable medium of claim 13 wherein the at least one stochastic model property is one of diffused aerial image signal; acid concentration or density; quencher concentration or density; inhibitor concentration or density; gradient of aerial image, acid, quencher, or inhibitor signal; mask pattern density; secondary electron concentration; ligand concentration; and resist surface tension.

15. The non-transitory computer readable medium of claim 13 wherein the deterministic correction is regressed against empirical data that includes local stochastic variations of the predicted characteristic.

16. The non-transitory computer readable medium of claim 15 wherein the empirical data includes one of line-edge roughness, critical dimension (CD) variation, and worst case CD.

17. The non-transitory computer readable medium of claim 13 wherein the deterministic model predicts hotspots in the printed pattern as a function of the mask pattern.

18. The non-transitory computer readable medium of claim 13 wherein the deterministic model predicts a failure rate in the printed pattern as a function of the mask pattern.

19. The non-transitory computer readable medium of claim 13 wherein the compact model predicts the characteristic of the printed pattern as a function of dose, focus, and the mask pattern.

* * * * *